United States Patent
Natali et al.

(10) Patent No.: US 10,415,153 B2
(45) Date of Patent: Sep. 17, 2019

(54) DOPED RARE EARTH NITRIDE MATERIALS AND DEVICES COMPRISING SAME

(71) Applicants: Franck Natali, Wellington (NZ); Benjamin John Ruck, Wellington (NZ); Harry Joseph Trodahl, Upper Moutere (NZ); Stephane Ange Vezian, Valbonne (FR)

(72) Inventors: Franck Natali, Wellington (NZ); Benjamin John Ruck, Wellington (NZ); Harry Joseph Trodahl, Upper Moutere (NZ); Stephane Ange Vezian, Valbonne (FR)

(*) Notice: Subject to any disclaimer, the term of this patent is extended or adjusted under 35 U.S.C. 154(b) by 154 days.

(21) Appl. No.: 15/300,757

(22) PCT Filed: Mar. 31, 2015

(86) PCT No.: PCT/NZ2015/050039
§ 371 (c)(1),
(2) Date: Sep. 29, 2016

(87) PCT Pub. No.: WO2015/152737
PCT Pub. Date: Oct. 8, 2015

(65) Prior Publication Data
US 2017/0022632 A1    Jan. 26, 2017

(30) Foreign Application Priority Data
Apr. 2, 2014 (NZ) .................................. 623339

(51) Int. Cl.
*C30B 29/38* (2006.01)
*C23C 14/06* (2006.01)
(Continued)

(52) U.S. Cl.
CPC ........ *C30B 23/066* (2013.01); *C23C 14/0641* (2013.01); *C23C 14/28* (2013.01);
(Continued)

(58) Field of Classification Search
CPC ..... C23C 14/0641; C23C 16/30; C23C 16/34; C30B 29/38; H01L 21/0254
See application file for complete search history.

(56) References Cited

U.S. PATENT DOCUMENTS 5,611,955 A    3/1997 Barrett et al.
5,998,232 A    12/1999 Maruska
(Continued)

FOREIGN PATENT DOCUMENTS

CN    87108239 A    6/1988
CN    1083520 A    3/1994
(Continued)

OTHER PUBLICATIONS

Highly resistive epitaxial Mg-doped GdN thin films, Lee et al., Appl. Phys. Lett. 106, 022401 (2015).*
(Continued)

*Primary Examiner* — Haidung D Nguyen
(74) *Attorney, Agent, or Firm* — Maschoff Brennan

(57) ABSTRACT

Disclosed herein are magnesium-doped rare earth nitride materials, some of which are semi-insulating or insulating. Also disclosed are methods for preparing the materials. The magnesium-doped rare earth nitride materials may be useful in the fabrication of, for example, spintronics, electronic and optoelectronic devices.

20 Claims, 3 Drawing Sheets

(51) Int. Cl.

| | | |
|---|---|---|
| *C23C 16/30* | (2006.01) | |
| *C30B 23/06* | (2006.01) | |
| *C30B 23/02* | (2006.01) | |
| *C30B 25/02* | (2006.01) | |
| *H01L 21/02* | (2006.01) | |
| *C23C 14/28* | (2006.01) | |
| *H01L 29/24* | (2006.01) | |

(52) U.S. Cl.
CPC ............ *C30B 23/02* (2013.01); *C30B 23/025* (2013.01); *C30B 25/02* (2013.01); *C30B 29/38* (2013.01); *H01L 21/0242* (2013.01); *H01L 21/0254* (2013.01); *H01L 21/02192* (2013.01); *H01L 21/02269* (2013.01); *H01L 21/02381* (2013.01); *H01L 21/02433* (2013.01); *H01L 21/02439* (2013.01); *H01L 21/02521* (2013.01); *H01L 21/02576* (2013.01); *H01L 21/02579* (2013.01); *H01L 21/02631* (2013.01); *H01L 29/24* (2013.01)

(56) References Cited

U.S. PATENT DOCUMENTS

| | | |
|---|---|---|
| 6,544,867 B1 | 4/2003 | Webb et al. |
| 6,791,866 B2 | 9/2004 | Ikeda |
| 7,037,806 B1 | 5/2006 | Atanackovic |
| 7,038,942 B2 | 5/2006 | Ohmori |
| 7,129,555 B2 | 10/2006 | Nozieres et al. |
| 7,170,095 B2 | 1/2007 | Vaudo et al. |
| 7,253,080 B1 | 8/2007 | Atanackovic |
| 7,271,981 B2 | 9/2007 | Ju et al. |
| 7,313,013 B2 | 12/2007 | Sun et al. |
| 7,332,781 B2 | 2/2008 | Nozieres et al. |
| 7,466,585 B2 | 12/2008 | Wu et al. |
| 7,471,543 B2 | 12/2008 | Nakashima et al. |
| 7,473,612 B2 | 1/2009 | Kanno et al. |
| 7,489,541 B2 | 2/2009 | Pakala et al. |
| 7,518,216 B2 | 4/2009 | Koukitu et al. |
| 7,560,724 B2 | 7/2009 | Aratani et al. |
| 7,580,276 B2 | 8/2009 | Sawa et al. |
| 7,684,147 B2 | 3/2010 | Ahn et al. |
| 7,719,082 B2 | 5/2010 | Aratani et al. |
| 7,755,136 B2 | 7/2010 | Nishikawa et al. |
| 7,816,737 B2 | 10/2010 | Clark |
| 7,932,505 B2 | 4/2011 | Sawa et al. |
| 8,012,442 B2 | 9/2011 | Clark |
| 8,088,466 B2 | 1/2012 | Nee |
| 8,102,701 B2 | 1/2012 | Prejbeanu et al. |
| 8,295,074 B2 | 10/2012 | Yasuda et al. |
| 8,331,139 B2 | 12/2012 | Gallagher et al. |
| 2005/0122828 A1 | 6/2005 | Odagawa et al. |
| 2006/0232193 A1 | 10/2006 | Fiedler et al. |
| 2007/0235821 A1 | 10/2007 | Clark |
| 2008/0248639 A1 | 10/2008 | Moriyama |
| 2010/0109018 A1 | 1/2010 | Baumann et al. |
| 2012/0230089 A1 | 9/2012 | Yamada et al. |
| 2013/0251942 A1 | 9/2013 | Azimi et al. |

FOREIGN PATENT DOCUMENTS

| | | |
|---|---|---|
| CN | 101101947 A | 1/2008 |
| JP | H11-121215 A | 4/1999 |
| JP | 2008/274342 A | 11/2008 |
| JP | 2010-059047 A | 3/2010 |
| JP | 2013089813 A | 5/2013 |
| JP | 2013-170098 A | 9/2013 |
| WO | 2012/020819 A1 | 2/2012 |
| WO | 2013/141953 A2 | 9/2013 |

OTHER PUBLICATIONS

Superconductivity in the ferromagnetic semiconductor samarium nitride, Anton et al., Physical Review B 94, 024106 (2016).*
International Search Report (ISR) from parent application PCT/NZ2015/050039, dated Nov. 30, 2015.
Written Opinion (WO), from parent application PCT/NZ2015/050039, dated Nov. 30, 2015.
J.W. Gerlach Et al. "Epitaxial gadolinium nitride thin films", Applied Physics Letter 90, 061919(2007), DOI: 10.1063/1.2472538, Feb. 8, 2007, pp. 061919-1-061919-3.
F. Natali et al. "Epitaxial growth and properties of GdN, EuN and SmN thin films", Physica Status Solidi C, vol. 9, Issue 3-4, DOI:10.1002/pssc.201100363 Dec. 7, 2011, pp. 605-608.
Krishnamoorthy, S., et al., "GdN Nanoisland-Based GaN Tunnel Junctions", Nano Letters, vol. 13, Issue 6, pp. 2570-2575 (2013).
Lee, C.M., et al., "Highly resistive epitaxial Mg-doped GdN thin films", Applied Physics Letters, vol. 106, pp. 022401-1-022401-4 (2015).
Natali, F. et al., "Rare-earth mononitrides", Progress in Materials Science, vol. 58, pp. 1-36 (2013).
Palguev, S.F., et al., "Ionic conductivity of nitrides", Solid State Ionics, vol. 20, Issue 4, pp. 255-258 (Jun. 1, 1986).
Supplementary European Search Report dated Oct. 9, 2017 as received in Application No. 15772411.3.
Japanese Office Action issued in corresponding application No. 2016-560766, dated Oct. 30, 2018.
Chinese Office Action issued in corresponding application No. 201580024829.8, dated Jun. 22, 2018.

* cited by examiner

DOPED RARE EARTH NITRIDE MATERIALS AND DEVICES COMPRISING SAME

TECHNICAL FIELD

The present invention relates to rare earth nitride semiconductors and, more particularly, to magnesium-doped rare earth nitride materials, some of which are semi-insulating or insulating. The present invention further relates to methods for preparing the materials, and devices comprising the materials.

BACKGROUND

The rare earths have atomic numbers from 57 (La) to 71 (Lu), and comprise the elements across which the 4f orbitals are filled: that is, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). They have atomic configurations $[Xe]6s^25d^14f^n$ or $[Xe]6s^24f^{n+1}$, with n varying from 0 for La to 14 for Lu. Their most common ionic charge state is 3+, with the 4f levels spanning the Fermi energy. They are the only stable elements with more than marginally filled f-shell electronic orbitals and, as a consequence, they are the elements with the largest spin and orbital moments. In ordered solids they contribute to the most strongly ferromagnetic materials, a contribution that has ensured their utility in technologies that require strong permanent magnets. Despite their name they are by no means rare, with the exception of promethium, which has no stable nuclear isotope.

The rare earth nitrides form in the face-centered cubic NaCl structure with lattice constants ranging from ~5.3 Å for LaN to ~4.76 Å for LuN, in total a 10% difference across the series and about 0.7% between nitrides of neighbouring atomic species. The rare earth nitrides were first investigated in the 1960s, when technological developments overcame the problems faced in separating the chemically similar members of the rare earth series. The rare earth nitrides have interesting magnetic and electronic properties. The rare earth nitrides have an optical bandgap typically of the order of 1 eV and are almost all ferromagnetic, with magnetic states that vary strongly across the series and coercive fields depending strongly on the growth conditions. For example, SmN is the only known near-zero-moment ferromagnetic semiconductor, with an enormous coercive field, and GdN has a coercive field some three orders of magnitude smaller.

The rare earth nitrides show promise in applications as diverse as spintronics, infrared (IR) detectors, and as contacts to group III nitride semiconductor compounds. For example, rare earth nitrides have been used in the fabrication of spin-filter Josephson junctions and field effect transistor structures.

The rare earth nitrides are also epitaxy-compatible materials with group III nitride semiconductors, a technologically important family of materials for the fabrication of, for example, optoelectronic devices and high power transistors. The properties of the rare earth nitrides are also complementary with those of the group III nitrides. A heterojunction involving these two semiconductor materials could have very attractive properties for multi-wavelength photonic devices and spin light emitting diodes. For example, GdN quantum dots have been shown to enhance the efficiency of GaN tunnel junctions.

Semi-insulating and insulating rare earth nitride layers, in particular, could be useful, optionally in combination with group III nitrides, in the fabrication of, for example, spintronics, electronic and optoelectronic devices. Such layers may avoid, for example, leakage current or degradation of radio frequency performance of such devices.

High quality epitaxial thin films of rare earth nitrides can be grown using ultra-high vacuum (UHV)-based methods, such as molecular beam epitaxy (MBE), pulsed-laser deposition (PLD), and DC/RF magnetron sputtering. However, such UHV-based methods typically result in unintentionally doped films that have a resistivity of the order of 0.05 to 10 mΩ·cm at room temperature and an n-type residual doping concentration associated with a background electron carrier concentration ranging from $10^{20}$ to $10^{22}$ cm$^{-3}$, which originates from nitrogen vacancy and depends on the growth conditions.

Accordingly, it is an object of the present invention to go some way to avoiding the above disadvantages; and/or to at least provide the public with a useful choice.

Other objects of the invention may become apparent from the following description which is given by way of example only.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed before the priority date.

SUMMARY OF THE INVENTION

In a first aspect, the present invention provides a magnesium-doped rare earth nitride material, wherein the rare earth nitride is selected from the group consisting of lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), and lutetium nitride (LuN), and alloys of any two or more thereof.

In a second aspect, the present invention provides a method of preparing a magnesium-doped rare earth nitride material of the invention, the method comprising the step of:
(a) combining the rare earth and a nitrogen source in the presence of a magnesium source and depositing the magnesium-doped rare earth nitride material.

In a third aspect, the present invention provides a magnesium-doped rare earth nitride material when prepared by a method of the second aspect.

The present invention also provides a magnesium-doped rare earth nitride material obtainable by a method of the second aspect.

The present invention also provides a device comprising a magnesium-doped rare earth nitride material of the invention.

This invention may also be said broadly to consist in the parts, elements and features referred to or indicated in the specification of the application, individually or collectively, and any or all combinations of any two or more said parts, elements or features, and where specific integers are mentioned herein which have known equivalents in the art to which this invention relates, such known equivalents are deemed to be incorporated herein as if individually set forth.

In addition, where features or aspects of the invention are described in terms of Markush groups, those persons skilled in the art will appreciate that the invention is also thereby described in terms of any individual member or subgroup of members of the Markush group.

As used herein "(s)" following a noun means the plural and/or singular forms of the noun.

As used herein the term "and/or" means "and" or "or" or both.

The term "comprising" as used in this specification means "consisting at least in part of". When interpreting each statement in this specification that includes the term "comprising", features other than that or those prefaced by the term may also be present. Related terms such as "comprise" and "comprises" are to be interpreted in the same manner.

The term "semi-insulating" as used in this specification means that the magnesium-doped rare earth nitride material has a resistivity between about $10^3$ Ω·cm and about $10^{10}$ Ω·cm at room temperature.

The term "insulating" as used in this specification means that the magnesium-doped rare earth nitride material has a resistivity greater than about $10^{10}$ Ω·cm at room temperature.

It is intended that reference to a range of numbers disclosed herein (for example, 1 to 10) also incorporates reference to all rational numbers within that range (for example, 1, 1.1, 2, 3, 3.9, 4, 5, 6, 6.5, 7, 8, 9 and 10) and also any range of rational numbers within that range (for example, 2 to 8, 1.5 to 5.5 and 3.1 to 4.7) and, therefore, all sub-ranges of all ranges expressly disclosed herein are hereby expressly disclosed. These are only examples of what is specifically intended and all possible combinations of numerical values between the lowest value and the highest value enumerated are to be considered to be expressly stated in this application in a similar manner.

Although the present invention is broadly as defined above, those persons skilled in the art will appreciate that the invention is not limited thereto and that the invention also includes embodiments of which the following description gives examples.

BRIEF DESCRIPTION OF THE DRAWINGS

The invention will now be described with reference to the Figures in which:

FIG. 4($b$) shows the field-dependent magnetisation of a Mg-doped GdN layer.

DETAILED DESCRIPTION OF THE INVENTION

Figure 1:
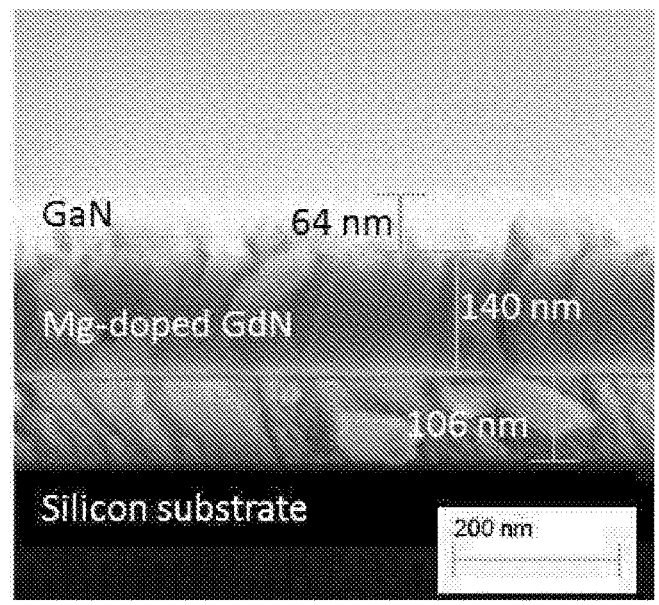
FIG. 1 is a cross section scanning electron microscope image showing the structure of a layer of Mg-doped GdN on a substrate, which comprises an AlN buffer layer deposited on silicon, and with a GaN capping layer.

It is difficult to grow semi-insulating and insulating rare earth nitride materials using known UHV-based methods. Such UHV-based methods typically result in unintentionally doped thin films that, when epitaxial, have a resistivity of the order of 0.05 to 10 mΩ·cm at room temperature and an n-type residual doping concentration associated with a background electron carrier concentration ranging from $10^{20}$ to $10^{22}$ cm$^{-3}$, which originates from nitrogen vacancy and depends on the growth conditions.

The present invention, however, provides magnesium-doped rare earth nitride materials, some of which are semi-insulating and insulating. The present invention also provides a method for preparing such materials by doping the growing rare earth nitride materials with magnesium, which is an acceptor dopant species, to compensate for the donor species and increase the resistivity. The method of the invention enables control of the conductivity of the rare earth nitride materials from n-type through to semi-insulating and insulating.

Accordingly, in a first aspect, the present invention provides a magnesium-doped rare earth nitride material, wherein the rare earth nitride is selected from the group consisting of lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), and lutetium nitride (LuN), and alloys of any two or more thereof.

The present invention also provides a magnesium-doped rare earth nitride material, wherein the rare earth nitride is selected from the group consisting of LaN, PrN, NdN, SmN, EuN, GdN, TbN, DyN, HoN, ErN, TmN, YbN, and LuN, and alloys of any two or more thereof, and wherein the magnesium-doped rare earth nitride material has an increased resistivity compared to the undoped rare earth nitride material.

The present invention also provides a semi-insulating or insulating magnesium-doped rare earth nitride material, wherein the rare earth nitride is selected from the group consisting of LaN, PrN, NdN, SmN, EuN, GdN, TbN, DyN, HoN, ErN, TmN, YbN, and LuN, and alloys of any two or more thereof.

The present invention also provides a magnesium-doped rare earth nitride material having a resistivity of at least about 25 Ω·cm, wherein the rare earth nitride is selected from the group consisting of LaN, PrN, NdN, SmN, EuN, GdN, TbN, DyN, HoN, ErN, TmN, YbN, and LuN, and alloys of any two or more thereof.

The present invention also provides a magnesium-doped rare earth nitride material having a resistivity of at least about $10^{10}$ Ω·cm, wherein the rare earth nitride is selected from the group consisting of LaN, PrN, NdN, SmN, EuN, GdN, TbN, DyN, HoN, ErN, TmN, YbN, and LuN, and alloys of any two or more thereof.

The present invention also provides a magnesium-doped rare earth nitride material having a resistivity between about $10^3$ Ω·cm and about $10^{10}$ Ω·cm, wherein the rare earth nitride is selected from the group consisting of LaN, PrN, NdN, SmN, EuN, GdN, TbN, DyN, HoN, ErN, TmN, YbN, and LuN, and alloys of any two or more thereof.

The present invention also provides a magnesium-doped rare earth nitride material having a resistivity of at least about $10^{10}$ Ω·cm, wherein the rare earth nitride is selected from the group consisting of LaN, PrN, NdN, SmN, EuN, GdN, TbN, DyN, HoN, ErN, TmN, YbN, and LuN, and alloys of any two or more thereof.

In some embodiments, the magnesium-doped rare earth nitride material of the invention has a resistivity of at least about $5 \times 10^3$ Ω·cm. In some embodiments, the magnesium-doped rare earth nitride material of the invention has a resistivity of at least about $10^4$ Ω·cm.

In contrast, undoped GdN typically has a resistivity of about $2 \times 10^{-3}$ Ω·cm.

In some embodiments, the rare earth nitride is selected from the group consisting of LaN, PrN, NdN, SmN, EuN, GdN, TbN, DyN, HoN, ErN, TmN, YbN, and LuN.

In some embodiments, the rare earth nitride is selected from the group consisting of LaN, PrN, NdN, SmN, GdN, TbN, DyN, HoN, ErN, TmN, and LuN, and alloys of any two or more thereof.

In some embodiments, the rare earth nitride is selected from the group consisting of LaN, PrN, NdN, SmN, GdN, TbN, DyN, HoN, ErN, TmN, and LuN.

In some embodiments, the rare earth nitride is selected from the group consisting of NdN, SmN, EuN, GdN, DyN, HoN, ErN, and YbN, and alloys of any two or more thereof.

In some embodiments, the rare earth nitride is selected from the group consisting of NdN, SmN, EuN, GdN, DyN, HoN, ErN, and YbN.

In some embodiments, the rare earth nitride is selected from the group consisting of NdN, SmN, GdN, DyN, HoN, and ErN, and alloys of any two or more thereof.

In some embodiments, the rare earth nitride is selected from the group consisting of NdN, SmN, GdN, DyN, HoN, and ErN.

In some embodiments, the rare earth nitride is a rare earth nitride alloy. In some embodiments, the rare earth nitride alloy is selected from the group consisting of (Sm,Gd)N, (Gd,Ho)N, and (Gd,Dy)N. In some embodiments, the rare earth nitride alloy is (Sm,Gd)N. In some embodiments, the rare earth nitride alloy is (Gd,Ho)N. In some embodiments, the rare earth nitride alloy is (Gd,Dy)N.

In some embodiments, the rare earth nitride is GdN.

Surprisingly, magnesium has been found to be effective to compensate residual donor species (that is, nitrogen vacancies) in rare earth nitrides and produce, in some embodiments, a rare earth nitride material that is at least semi-insulating.

In some embodiments, the magnesium-doped rare earth nitride material of the invention comprises about $10^{18}$-$10^{21}$ atoms/cm$^3$ of magnesium. In some embodiments, the magnesium-doped rare earth nitride material of the invention comprises about $10^{18}$-$5 \times 10^{20}$ atoms/cm$^3$ of magnesium. In some embodiments, the magnesium-doped rare earth nitride material of the invention comprises about $10^{19}$-$5 \times 10^{20}$ atoms/cm$^3$ of magnesium.

The magnesium-doped rare earth nitride material of the invention may, however, further comprise one or more additional dopant(s). Generally, the magnesium-doped rare earth nitride material of the invention comprises less than about $10^{21}$ atoms/cm$^3$ of additional dopant(s) or other impurities. In some embodiments, the magnesium-doped rare earth nitride material of the invention comprises less than about $10^{20}$ atoms/cm$^3$ of additional dopant(s) or other impurities. In some embodiments, the magnesium-doped rare earth nitride material of the invention comprises less than about $10^{19}$ atoms/cm$^3$ of additional dopant(s) or other impurities.

In some embodiments, the magnesium-doped rare earth nitride material is a thin film.

In some embodiments, the film thickness is about 1-2000 nm. In some embodiments, the film thickness is about 5-2000 nm. In some embodiments, the film thickness is about 1-1000 nm. In some embodiments, the film thickness is about 5-1000 nm. In some embodiments, the film thickness is about 10-200 nm.

Advantageously, the magnesium-doped rare earth nitride material of the invention has an increased resistivity compared to the undoped rare earth nitride material. The magnetic properties of the magnesium-doped rare earth nitride material are, however, generally not substantially different to those of the undoped rare earth nitride material.

The magnetic properties of the magnesium-doped rare earth nitride material can be measured using known techniques and instrumentation, such as a superconducting quantum interference device (SQUID). In some embodiments, the magnesium-doped rare earth nitride material is ferromagnetic below about 50 K, preferably below about 70 K.

In addition, the structural properties of the magnesium-doped rare earth nitride material are generally not substantially different to those of the undoped rare earth nitride material.

The structural properties of the magnesium-doped rare earth nitride material can be measured using known techniques and instrumentation, such as x-ray diffraction (XRD) measurements. In some embodiments, the magnesium-doped rare earth nitride material has substantially the same XRD measurements as the undoped rare earth nitride.

In some embodiments, the magnesium-doped rare earth nitride material comprises a thin film on a substrate.

Suitable substrates are non-reactive with the magnesium-doped rare earth nitride material and are stable during the processing conditions used for preparing the magnesium-doped rare earth nitride material.

In some embodiments, the substrate is a conductor. In other embodiments, the substrate is a semiconductor. In other embodiments, the substrate is an insulator.

In some embodiments, the substrate is crystalline, but the invention is not limited thereto.

In some embodiments, the magnesium-doped rare earth nitride material is epitaxial with the substrate. In other embodiments, the magnesium-doped rare earth nitride material is polycrystalline.

In some embodiments, the substrate is AlN, GaN or an (Al,In,Ga)N alloy.

Other suitable substrates include, but are not limited to, yttria-stabilized zirconia (YSZ) and MgO.

Further suitable substrates include, but are not limited to Al, W, Cr, Cu, Gd, Mg, TaN, NbN, GaAs, and MgF$_2$.

Suitable substrates also include multilayer-structured materials. For example, multilayer-structured substrates may comprise a buffer layer in contact with the magnesium-doped rare earth nitride material.

In some embodiments, the multilayer-structured material comprises a buffer layer of an undoped rare earth nitride.

In some embodiments, the substrate comprises Si or Al$_2$O$_3$, optionally with a buffer layer of AlN or GaN. In other embodiments, the buffer layer is an (Al,In,Ga)N alloy.

In some embodiments, the substrate comprises deoxidized silicon oriented along the (111) plane. In some embodiments, the substrate comprises deoxidized silicon oriented along the (111) plane with an epitaxial AlN buffer layer.

In some embodiments, the magnesium-doped rare earth nitride material is capped.

Due to their decomposition in air, thin films of rare earth nitrides on a substrate are generally passivated with an effective capping layer to avoid reaction with the ambient atmosphere.

Suitable capping layers are non-reactive with the magnesium-doped rare earth nitride material.

The capping layer may be epitaxial with the magnesium-doped rare earth nitride material, polycrystalline, or amorphous.

In some embodiments, the capping layer is a conductor. In other embodiments, the capping layer is a semiconductor. In other embodiments, the capping layer is an insulator.

Suitable materials for the capping layer include, but are not limited to Al, W, Cr, Cu, Gd, Mg, TaN, NbN, Si, YSZ, GaN, GaAs, AlN, (Al,In,Ga)N alloys, and $MgF_2$.

In some embodiments, the capping layer is selected from AlN, GaN, (Al,In,Ga)N alloys, and Si.

In some embodiments, the capping layer is selected from AlN and GaN. Advantageously, AlN and GaN are transparent, allowing optical measurements. Other advantages of AlN and GaN include their ease of growth and good chemical stability over time.

In some embodiments, the capping layer is GaN.

The magnesium-doped rare earth nitride material may be prepared by growing the rare earth nitride in the presence of magnesium atoms. However, the invention is not limited thereto, and the magnesium-doped rare earth nitride material may be prepared by other methods known to those skilled in the art, including but not limited to implantation and diffusion methods.

Accordingly, in a second aspect, the present invention provides a method of preparing a magnesium-doped rare earth nitride material of the invention, the method comprising the step of:
 (a) combining the rare earth and a nitrogen source in the presence of a magnesium source and depositing the magnesium-doped rare earth nitride material.

In some embodiments, the magnesium-doped rare earth nitride material is deposited on a substrate. Suitable substrates are discussed above.

Accordingly, in some embodiments, the present invention provides a method of preparing a magnesium-doped rare earth nitride material of the invention, the method comprising the step of:
 (a) combining the rare earth and a nitrogen source in the presence of a magnesium source and depositing the magnesium-doped rare earth nitride material on a substrate.

In some embodiments, the method further comprises the step of:
 (b) depositing a capping layer on the magnesium-doped rare earth nitride deposited in step (a).

Suitable capping layers are discussed above.

The magnesium-doped rare earth nitride material, and the optional capping layer, can be deposited using ultra-high vacuum techniques known to those skilled in the art. Suitable techniques include, but are not limited to, physical vapour deposition (PVD), including pulsed laser deposition (PLD) and DC/RF magnetron sputtering, thermal evaporation, and molecular beam epitaxy (MBE). Other techniques, including but not limited to metalorganic chemical vapour deposition (MOCVD), may also be used.

In some embodiments, the magnesium-doped rare earth nitride material and the optional capping layer are sequentially deposited by MBE. In some of these embodiments, reflection high energy electron diffraction (RHEED) is used for monitoring the growth of the layer(s).

The base pressure in the MBE apparatus is typically about $10^{-8}$ Torr or less.

The magnesium source is a magnesium-containing substance capable of providing gaseous magnesium atoms at the growth surface. In some embodiments, the magnesium source is magnesium.

In those embodiments wherein the magnesium-doped rare earth nitride material is deposited by MBE, the magnesium source can be an effusion cell containing solid magnesium, which is evaporated during the deposition.

Similarly, the rare earth can be provided from a source of the rare earth element, such as an effusion cell containing the solid rare earth, which is evaporated during the deposition.

Those persons skilled in the art will appreciate that the doping level in the magnesium-doped rare earth nitride material can be controlled by controlling the relative rates of evaporation of the magnesium and the rare earth.

The nitrogen source provides reactive nitrogen atoms at the growth surface. In some embodiments, the nitrogen source is selected from the group consisting of pure molecular nitrogen, ammonia, and a source of active nitrogen, such as a nitrogen plasma or ionized nitrogen, or mixtures of any two or more thereof.

In some embodiments, the nitrogen source is selected from the group consisting of pure molecular nitrogen, ammonia, and a source of active nitrogen, such as a nitrogen plasma or ionized nitrogen.

In some embodiments, the nitrogen source is ammonia.

The nitrogen source flux is typically a factor of at least 100 larger than the rare earth flux. If the ratio of the nitrogen source flux to the rare earth flux is less than about 100, the resulting films are likely to be heavily doped by nitrogen vacancies.

In some embodiments wherein the magnesium-doped rare earth nitride material is deposited by MBE, the partial pressure or beam equivalent pressure (BEP) of the nitrogen source is about $10^{-5}$-$10^{-3}$ Torr, preferably about $10^{-5}$-$10^{4}$ Torr.

In some embodiments, the BEP of the nitrogen source is about $1.9\times10^{-5}$ Torr.

In some embodiments, the BEP of the rare earth is about $10^{-8}$-$10^{-7}$ Torr.

In some embodiments, the BEP of the rare earth is about $5\times10^{-8}$ Torr.

In some embodiments, the BEP of magnesium is about $10^{-9}$-$5\times10^{-6}$ Torr, preferably about $10^{-9}$-$5\times10^{-7}$ Torr.

The magnesium-doped rare earth nitride material is typically deposited at a rate of about 0.01-1 nm/second. In some embodiments, the magnesium-doped rare earth nitride material is deposited at a rate of about 0.01-0.5 nm/second. In some embodiments, the magnesium-doped rare earth nitride material is deposited at a rate of about 0.01-0.15 nm/second. In some embodiments, the magnesium-doped rare earth nitride material is deposited at a rate of about 0.01-0.1 nm/second.

In some embodiments, the magnesium-doped rare earth nitride material is deposited at ambient or elevated temperatures.

The magnesium-doped rare earth nitride material is generally deposited at elevated temperatures where it is desirable that the material be epitaxial with the substrate on which it is to be deposited.

Accordingly, in some embodiments, the magnesium-doped rare earth nitride material is deposited at a temperature of about 500-900° C. In some embodiments, the magnesium-doped rare earth nitride material is deposited at a temperature of about 500-750° C.

The magnesium-doped rare earth nitride material may, however, be deposited at lower temperatures than those above, or even at ambient temperature, particularly if a polycrystalline material is desired. Depositing the magnesium-doped rare earth nitride material at lower temperatures typically results in fewer nitrogen vacancies.

The temperature during the deposition may be conveniently measured with an optical pyrometer, or other suitable apparatus as is known in the art, for example a thermocouple.

In some embodiments, two or more rare earth elements are simultaneously evaporated in the presence of a nitrogen source and a magnesium source, as discussed above, to provide a magnesium-doped rare earth nitride material of the invention wherein the rare earth nitride is an alloy.

Similarly, in those embodiments wherein the substrate and/or capping layer comprise(s) a group III nitride, alloys of group III nitrides are also contemplated.

Those persons skilled in the art will appreciate that one or more dopants may be introduced during deposition of the magnesium-doped rare earth nitride material. Such dopants can alter the magnetic and/or electric properties of the resulting magnesium-doped rare earth nitride material.

In a third aspect, the present invention provides a magnesium-doped rare earth nitride material when prepared by a method of the second aspect.

The present invention also provides a magnesium-doped rare earth nitride material obtainable by a method of the second aspect.

The magnesium-doped rare earth nitride material of the invention may be useful in the fabrication of, for example, spintronics, electronic and optoelectronic devices.

Accordingly, the present invention also provides a device comprising a magnesium-doped rare earth nitride material of the invention.

The following non-limiting examples are provided to illustrate the present invention and in no way limit the scope thereof.

EXAMPLES

Gadolinium nitride films doped with magnesium (Mg-doped GdN) were grown in a molecular beam epitaxy system equipped with conventional Al, Ga, Mg and Gd evaporation cells. The purity of the as-received Al, Ga, Mg and Gd solid charges was 6N5, 7N5, 5N and 3N, respectively. Atomic nitrogen species were produced by the thermally activated decomposition of ammonia ($NH_3$) on the growing surface. The purity of the $NH_3$ was 6N5. Prior to the growth of Mg-doped GdN, a 100 nm thick AlN buffer layer was grown on a deoxidized silicon substrate oriented along the (111) plane.

The Mg-doped GdN films were grown at a substrate temperature of 650° C. using a beam equivalent pressure (BEP) of $1.9 \times 10^{-5}$ Torr and $5 \times 10^{-8}$ Torr for $NH_3$ and Gd, respectively, leading to a growth rate of about $0.12 \pm 0.01$ μm/h. The BEP of magnesium typically ranged from $10^{-9}$ to $5 \times 10^{-7}$ Torr.

The thickness of the Mg-doped GdN films ranged from 100 nm to 200 nm. The Mg-doped GdN layers were capped with a 60 nm thick GaN layer to prevent decomposition in air.

Undoped GdN films grown under the conditions described above had a resistivity of about $2 \times 10^{-3}$ Ω·cm at room temperature, while incorporating Mg in the GdN layer led to higher resistivity. Mg-doped GdN layers with a Mg concentration of about $1 \times 10^{19}$ atoms/cm$^3$ and about $5 \times 10^{19}$ atoms/cm$^3$ had resistivities of about 25 Ω·cm and greater than $10^4$ Ω·cm, respectively.

Unless otherwise specified, the resistivity was measured at room temperature using a van der Pauw geometry.

The resistivity of undoped GdN films grown under the conditions described above is about $1.7 \times 10^{-3}$ Ω·cm at 4 K.

Mg-doped GdN layers with a Mg concentration of about $1 \times 10^{19}$ atoms/cm$^3$ and about $5 \times 10^{19}$ atoms/cm$^3$ had resistivities at 4K of about 4 Ω·cm and greater than $10^4$ Ω·cm, respectively.

FIG. 1 is a cross section scanning electron microscope image showing the structure of a 140 nm thick layer of Mg-doped GdN on a substrate, which comprises a 106 nm thick AlN buffer layer deposited on silicon, and with a 64 nm thick GaN capping layer.

Figure 2:
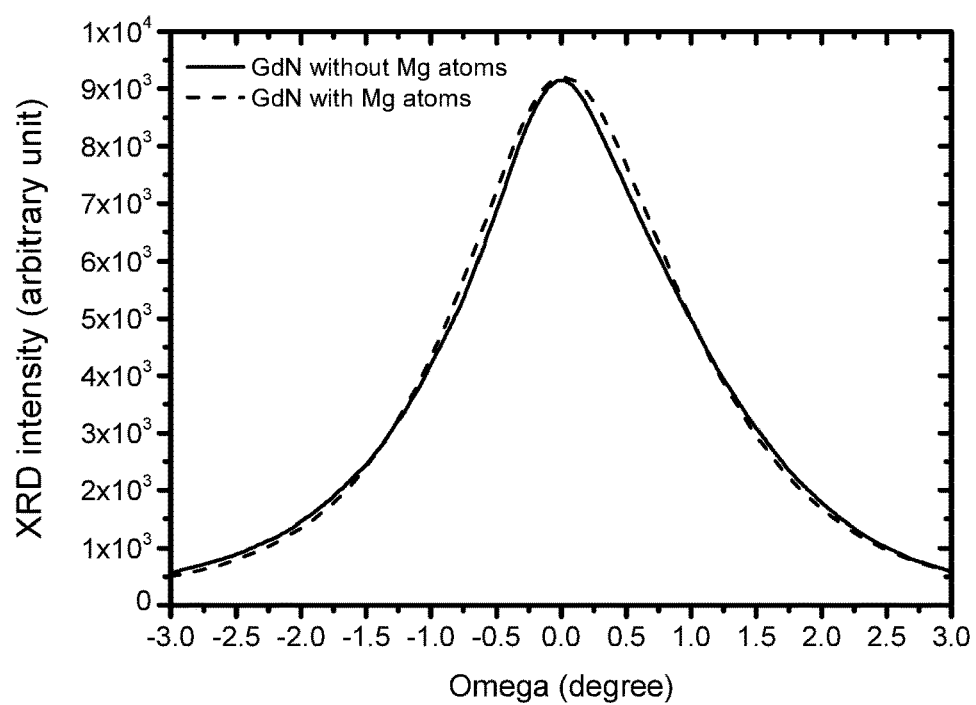
FIG. 2 shows the (111) x-ray rocking curves for a Mg-doped GdN layer and for an undoped GdN layer.

The crystalline order/quality of a Mg-doped GdN layer is comparable to that of an undoped GdN layer grown under the same conditions. FIG. 2 shows that for a 140 nm thick Mg-doped GdN layer with a concentration of $5 \times 10^{19}$ Mg atoms/cm$^3$ grown at 650° C. the (111) x-ray rocking curve full width at half maximum (FWHM) is comparable with the FWHM for an undoped GdN layer.

Figure 3:
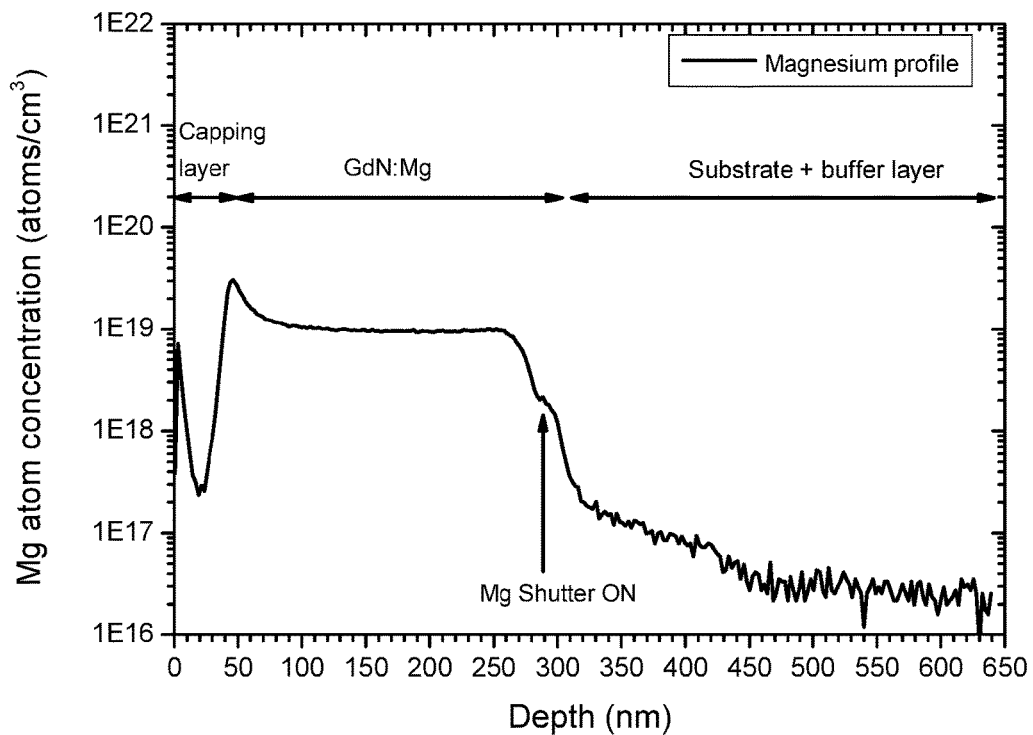
FIG. 3 shows the measured secondary ion mass spectrometry magnesium profile of a Mg-doped GdN layer on a substrate, which comprises an AlN buffer layer deposited on silicon, and with a GaN capping layer.

FIG. 3 shows the measured secondary ion mass spectrometry (SIMS) magnesium profile of a Mg-doped GdN layer on a substrate, which comprises an AlN buffer layer deposited on silicon, and with a GaN capping layer. The atomic concentration of magnesium is about $1 \times 10^{19}$ atoms/cm$^3$.

Figure 4:
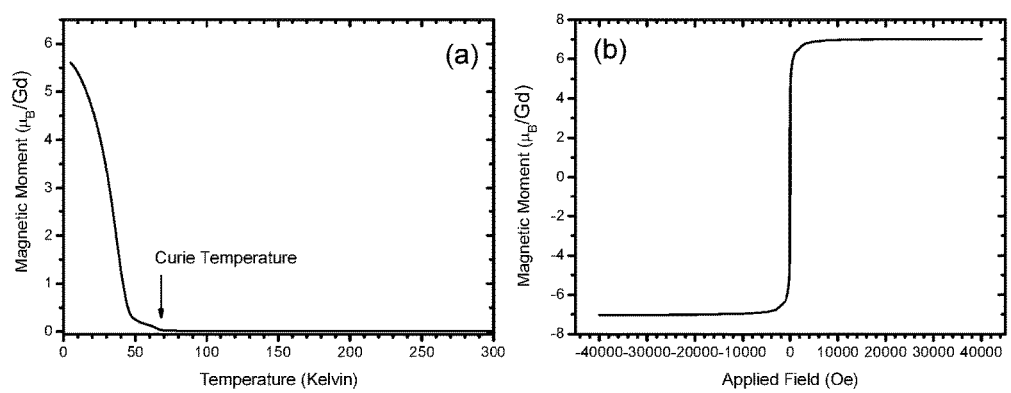
FIG. 4($a$) shows the in-plane zero field-cooled magnetisation of a Mg-doped GdN layer.

The magnetization curves shown in FIG. 4 confirm that the magnetic properties of a Mg-doped GdN layer are substantially the same as those of an undoped GdN layer. FIG. 4(a) shows the in-plane zero field-cooled (ZFC) magnetisation under an applied field of 250 Oe of a 140 nm thick Mg-doped GdN layer with a Mg concentration of about $5 \times 10^{19}$ atoms/cm$^3$ measured by SIMS. The Curie temperature is about 70K as per undoped GdN thin films. FIG. 4(b) shows the field-dependent magnetisation at 5K of a 140 nm thick Mg-doped GdN layer with a Mg concentration of about $5 \times 10^{19}$ atoms/cm$^3$ measured by SIMS. The magnetic moment is about 7 Bohr magneton per gadolinium ion and the coercive field about 100 Oe as per undoped GdN films.

Figure 5:
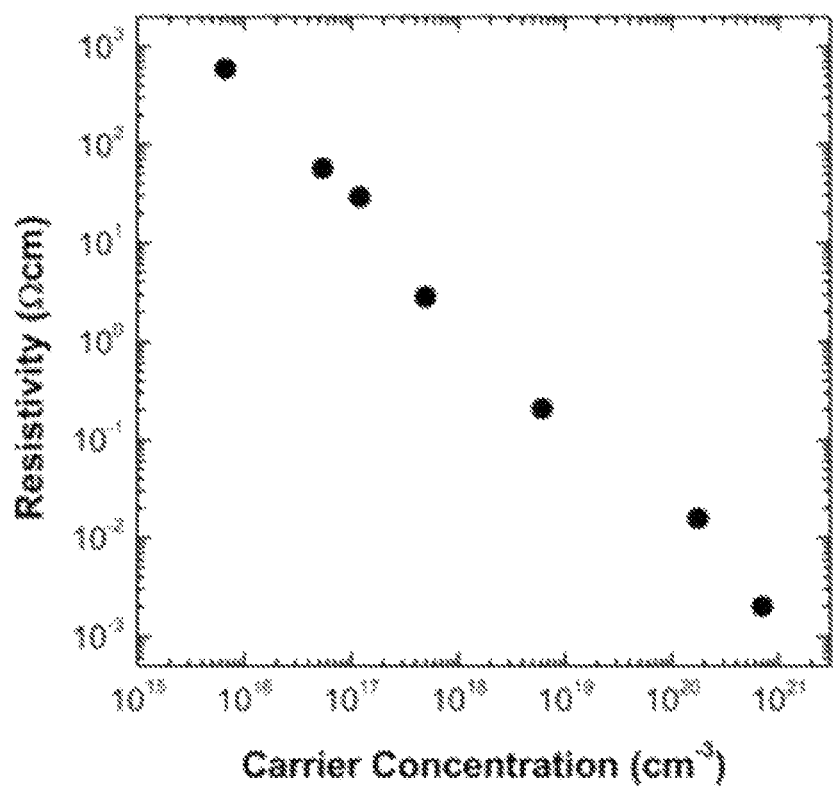
FIG. 5 shows the resistivity of Mg-doped GdN layers as a function of the electron carrier concentration.

Resistivity and Hall effect measurements were performed at room temperature on Mg-doped GdN films with various Mg concentrations. FIG. 5 shows the resistivity of 100 nm thick Mg-doped GdN layers as a function of the electron carrier concentration. The room temperature resistivity varies inversely with the electron density over five orders of magnitude. For example, an undoped GdN layer has a resistivity of about 0.002 Ω·cm and an electron carrier concentration of $6.9 \times 10^{20}$ cm$^{-3}$ while an Mg-doped GdN layer with a Mg concentration of about $5 \times 10^{19}$ atoms/cm$^3$ has resistivity of about $10^4$ Ω·cm and an electron carrier concentration of $6.6 \times 10^{15}$ cm$^{-3}$.

Various aspects of the present invention are described by the following clauses:

1. A magnesium-doped rare earth nitride material, wherein the rare earth nitride is selected from the group consisting of lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), and lutetium nitride (LuN), and alloys of any two or more thereof.

2. A magnesium-doped rare earth nitride material of clause 1, wherein the magnesium-doped rare earth nitride material has an increased resistivity compared to the undoped rare earth nitride material.

3. A magnesium-doped rare earth nitride material of clause 1 or 2, wherein the magnesium-doped rare earth nitride material has a resistivity of at least about 25 Ω·cm.

4. A magnesium-doped rare earth nitride material of clauses 1 to 3, wherein the magnesium-doped rare earth nitride material has a resistivity of at least about $10^3$ Ω·cm.
5. A magnesium-doped rare earth nitride material of clauses 1 to 4, wherein the magnesium-doped rare earth nitride material has a resistivity between about $10^3$ Ω·cm and about $10^{10}$ Ω·cm.
6. A magnesium-doped rare earth nitride material of clauses 1 to 4, wherein the magnesium-doped rare earth nitride material has a resistivity of at least about $10^{10}$ Ω·cm.
7. A magnesium-doped rare earth nitride material of clauses 1 to 6, wherein the rare earth nitride is selected from the group consisting of LaN, PrN, NdN, SmN, GdN, TbN, DyN, HoN, ErN, TmN, and LuN, and alloys of any two or more thereof.
8. A magnesium-doped rare earth nitride material of clauses 1 to 6, wherein the rare earth nitride is selected from the group consisting of NdN, SmN, EuN, GdN, DyN, HoN, ErN, and YbN, and alloys of any two or more thereof.
9. A magnesium-doped rare earth nitride material of clauses 1 to 8, wherein the rare earth nitride is selected from the group consisting of NdN, SmN, GdN, DyN, HoN, and ErN, and alloys of any two or more thereof.
10. A magnesium-doped rare earth nitride material of clauses 1 to 7, wherein the rare earth nitride is selected from the group consisting of LaN, PrN, NdN, SmN, GdN, TbN, DyN, HoN, ErN, TmN, and LuN.
11. A magnesium-doped rare earth nitride material of clauses 1 to 6 and 8, wherein the rare earth nitride is selected from the group consisting of NdN, SmN, EuN, GdN, DyN, HoN, ErN, and YbN.
12. A magnesium-doped rare earth nitride material of clauses 1 to 11, wherein the rare earth nitride is selected from the group consisting of NdN, SmN, GdN, DyN, HoN, and ErN.
13. A magnesium-doped rare earth nitride material of clauses 1 to 12, wherein the rare earth nitride is GdN.
14. A magnesium-doped rare earth nitride material of clauses 1 to 9, wherein the rare earth nitride is a rare earth nitride alloy.
15. A magnesium-doped rare earth nitride material of clause 14, wherein the rare earth nitride alloy is selected from the group consisting of (Sm,Gd)N, (Gd,Ho)N, and (Gd,Dy)N.
16. A magnesium-doped rare earth nitride material of clauses 1 to 15, comprising about $10^{18}$-$10^{21}$ atoms/cm$^3$ of magnesium.
17. A magnesium-doped rare earth nitride material of clauses 1 to 16, further comprising one or more additional dopant(s).
18. A magnesium-doped rare earth nitride material of clauses 1 to 17, comprising less than about $10^{21}$ atoms/cm$^3$ of additional dopant(s) or other impurities.
19. A magnesium-doped rare earth nitride material of clauses 1 to 18, wherein the magnesium-doped rare earth nitride material is ferromagnetic below about 50 K.
20. A magnesium-doped rare earth nitride material of clauses 1 to 19, wherein the magnesium-doped rare earth nitride material is ferromagnetic below about 70 K.
21. A magnesium-doped rare earth nitride material of clauses 1 to 20, wherein the magnesium-doped rare earth nitride material has substantially the same XRD measurements as the undoped rare earth nitride.
22. A magnesium-doped rare earth nitride material of clauses 1 to 21, wherein the magnesium-doped rare earth nitride material is a thin film.
23. A magnesium-doped rare earth nitride material of clause 22, wherein the film thickness is about 1-2000 nm.
24. A magnesium-doped rare earth nitride material of clause 22 or 23, wherein the thin film is on a substrate.
25. A magnesium-doped rare earth nitride material of clause 24, wherein the magnesium-doped rare earth nitride material is epitaxial with the substrate.
26. A magnesium-doped rare earth nitride material of clause 24 or 25, wherein the substrate comprises a buffer layer in contact with the magnesium-doped rare earth nitride material.
27. A magnesium-doped rare earth nitride material of clauses 1 to 26, wherein the magnesium-doped rare earth nitride material is capped.
28. A magnesium-doped rare earth nitride material of clause 27, wherein the capping layer is epitaxial with the magnesium-doped rare earth nitride material.
29. A method of preparing a magnesium-doped rare earth nitride material, wherein the rare earth nitride is selected from the group consisting of lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), and lutetium nitride (LuN), and alloys of any two or more thereof, the method comprising the step of:
    (a) combining the rare earth and a nitrogen source in the presence of a magnesium source and depositing the magnesium-doped rare earth nitride material.
30. A method of clause 29, wherein the magnesium-doped rare earth nitride material has an increased resistivity compared to the undoped rare earth nitride material.
31. A method of clause 29 or 30, wherein the magnesium-doped rare earth nitride material has a resistivity of at least about 25 Ω·cm.
32. A method of clauses 29 to 31, wherein the magnesium-doped rare earth nitride material has a resistivity of at least about $10^3$ Ω·cm.
33. A method of clauses 29 to 32, wherein the magnesium-doped rare earth nitride material has a resistivity between about $10^3$ Ω·cm and about $10^{10}$ Ω·cm.
34. A method of clauses 29 to 32, wherein the magnesium-doped rare earth nitride material has a resistivity of at least about $10^{10}$ Ω·cm.
35. A method of clauses 29 to 34, wherein the rare earth nitride is selected from the group consisting of LaN, PrN, NdN, SmN, GdN, TbN, DyN, HoN, ErN, TmN, and LuN, and alloys of any two or more thereof.
36. A method of clauses 29 to 34, wherein the rare earth nitride is selected from the group consisting of NdN, SmN, EuN, GdN, DyN, HoN, ErN, and YbN, and alloys of any two or more thereof.
37. A method of clauses 29 to 36, wherein the rare earth nitride is selected from the group consisting of NdN, SmN, GdN, DyN, HoN, and ErN, and alloys of any two or more thereof.

38. A method of clauses 29 to 35, wherein the rare earth nitride is selected from the group consisting of LaN, PrN, NdN, SmN, GdN, TbN, DyN, HoN, ErN, TmN, and LuN.
39. A method of clauses 29 to 34 and 36, wherein the rare earth nitride is selected from the group consisting of NdN, SmN, EuN, GdN, DyN, HoN, ErN, and YbN.
40. A method of clauses 29 to 39, wherein the rare earth nitride is selected from the group consisting of NdN, SmN, GdN, DyN, HoN, and ErN.
41. A method of clauses 29 to 40, wherein the rare earth nitride is GdN.
42. A method of clauses 29 to 37, wherein the rare earth nitride is a rare earth nitride alloy.
43. A method of clause 42, wherein the rare earth nitride alloy is selected from the group consisting of (Sm,Gd)N, (Gd,Ho)N, and (Gd,Dy)N.
44. A method of clauses 29 to 43, wherein the magnesium-doped rare earth nitride material comprises about $10^{18}$-$10^{21}$ atoms/cm$^3$ of magnesium.
45. A method of clauses 29 to 44, wherein the magnesium-doped rare earth nitride material further comprises one or more additional dopant(s).
46. A method of clauses 29 to 45, wherein the magnesium-doped rare earth nitride material comprises less than about $10^{21}$ atoms/cm$^3$ of additional dopant(s) or other impurities.
47. A method of clauses 29 to 46, wherein the magnesium-doped rare earth nitride material is ferromagnetic below about 50 K.
48. A method of clauses 29 to 47, wherein the magnesium-doped rare earth nitride material is ferromagnetic below about 70 K.
49. A method of clauses 29 to 48, wherein the magnesium-doped rare earth nitride material has substantially the same XRD measurements as the undoped rare earth nitride.
50. A method of preparing a magnesium-doped rare earth nitride material of clauses 1 to 23, the method comprising the step of:
   (a) combining the rare earth and a nitrogen source in the presence of a magnesium source and depositing the magnesium-doped rare earth nitride material.
51. A method of clauses 29 to 50, wherein the magnesium-doped rare earth nitride material is deposited on a substrate.
52. A method of clause 51, wherein the magnesium-doped rare earth nitride material is epitaxial with the substrate.
53. A method of clauses 29 to 52, the method further comprising the step of:
   (b) depositing a capping layer on the magnesium-doped rare earth nitride deposited in step (a).
54. A method of clause 53, wherein the capping layer is epitaxial with the magnesium-doped rare earth nitride material.
55. A method of clauses 29 to 54, wherein the magnesium-doped rare earth nitride material is deposited using an ultra-high vacuum technique.
56. A method of clause 55, wherein the ultra-high vacuum technique is selected from the group consisting of physical vapour deposition (PVD), pulsed laser deposition (PLD), DC/RF magnetron sputtering, thermal evaporation, and molecular beam epitaxy (MBE).
57. A method of clauses 29 to 56, wherein the magnesium-doped rare earth nitride material is deposited by MBE.
58. A method of clauses 29 to 57, wherein the magnesium source is magnesium.
59. A method of clauses 29 to 58, wherein the nitrogen source is selected from the group consisting of pure molecular nitrogen, ammonia, and a source of active nitrogen, or mixtures of any two or more thereof.
60. A method of clause 59, wherein the source of active nitrogen is a nitrogen plasma or ionized nitrogen
61. A method of clauses 29 to 59, wherein the nitrogen source is ammonia.
62. A method of clauses 29 to 61, wherein the nitrogen source flux is a factor of at least 100 larger than the rare earth flux.
63. A method of clauses 29 to 62, wherein the magnesium-doped rare earth nitride material is deposited by MBE, and the partial pressure or beam equivalent pressure (BEP) of the nitrogen source is about $10^{-5}$-$10^{-3}$ Torr.
64. A method of clause 63, wherein the BEP of the rare earth is about $10^{-8}$-$10^{-7}$ Torr.
65. A method of clause 63 or 64, wherein the BEP of magnesium is about $10^{-9}$-$5\times10^{-6}$ Torr.
66. A method of clauses 29 to 65, wherein the magnesium-doped rare earth nitride material is deposited at a rate of about 0.01-1 nm/second.
67. A method of clauses 29 to 66, wherein the magnesium-doped rare earth nitride material is deposited at ambient or elevated temperatures.
68. A method of clauses 29 to 67, wherein the magnesium-doped rare earth nitride material is deposited at a temperature of about 500-900° C.
69. A method of clauses 29 to 68, wherein the magnesium-doped rare earth nitride material is deposited at a temperature of about 500-750° C.
70. A magnesium-doped rare earth nitride material when prepared by a method of clauses 29 to 69.
71. A magnesium-doped rare earth nitride material obtainable by a method of clauses 29 to 69.
72. A device comprising a magnesium-doped rare earth nitride material of clauses 1 to 28, 70 and 71.

It is not the intention to limit the scope of the invention to the abovementioned examples only. As would be appreciated by a skilled person in the art, many variations are possible without departing from the scope of the invention as set out in the accompanying claims.

What is claimed is:

1. A magnesium-doped rare earth nitride material, wherein the rare earth nitride is selected from the group consisting of lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), and lutetium nitride (LuN), and alloys of any two or more thereof, wherein the magnesium-doped rare earth nitride material is a thin film.

2. A magnesium-doped rare earth nitride material as claimed in claim 1, wherein the magnesium-doped rare earth nitride material has a resistivity of at least about 25 Ω·cm.

3. A magnesium-doped rare earth nitride material as claimed in claim 1, comprising about $10^{18}$-$10^{21}$ atoms/cm$^3$ of magnesium.

4. A magnesium-doped rare earth nitride material as claimed in claim 1, further comprising one or more additional dopant(s).

5. A magnesium-doped rare earth nitride material as claimed in claim 1, wherein the magnesium-doped rare earth nitride material is ferromagnetic below about 70 K.

6. A magnesium-doped rare earth nitride material as claimed in claim 1, wherein the magnesium-doped rare earth nitride material has substantially the same XRD measurements as the undoped rare earth nitride.

7. A magnesium-doped rare earth nitride material as claimed in claim 1, wherein the thin film thickness is 1-2000 nm or 1-1000 nm.

8. A magnesium-doped rare earth nitride material as claimed in claim 1, wherein the thin film thickness is 10-200 nm.

9. A method of preparing a magnesium-doped rare earth nitride material, wherein the rare earth nitride is selected from the group consisting of lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), and lutetium nitride (LuN), and alloys of any two or more thereof, the method comprising the step of:
(a) combining the rare earth and a nitrogen source in the presence of a magnesium source and depositing the magnesium-doped rare earth nitride material.

10. A method as claimed in claim 9, wherein the magnesium-doped rare earth nitride material has a resistivity of at least about 25 Ω·cm.

11. A method as claimed in claim 9, wherein the magnesium-doped rare earth nitride material comprises about $10^{18}$-$10^{21}$ atoms/cm$^3$ of magnesium.

12. A method as claimed in claim 9, wherein the magnesium-doped rare earth nitride material further comprises one or more additional dopant(s).

13. A method as claimed in claim 9, wherein the magnesium-doped rare earth nitride material is ferromagnetic below about 70 K.

14. A method as claimed in claim 9, wherein the magnesium-doped rare earth nitride material has substantially the same XRD measurements as the undoped rare earth nitride.

15. A method as claimed in claim 9, wherein the magnesium-doped rare earth nitride material is deposited on a substrate.

16. A method as claimed in claim 9, the method further comprising the step of:
(b) depositing a capping layer on the magnesium-doped rare earth nitride deposited in step (a).

17. A method as claimed in claim 9, wherein the nitrogen source is selected from the group consisting of pure molecular nitrogen, ammonia, and a source of active nitrogen, or mixtures of any two or more thereof.

18. A method as claimed in claim 9, wherein the magnesium-doped rare earth nitride material is deposited at a rate of about 0.01-1 nm/second.

19. A method as claimed in claim 9, wherein the magnesium-doped rare earth nitride material is deposited at ambient or elevated temperatures.

20. A device comprising a magnesium-doped rare earth nitride material, wherein the rare earth nitride is selected from the group consisting of lanthanum nitride (LaN), praseodymium nitride (PrN), neodymium nitride (NdN), samarium nitride (SmN), europium nitride (EuN), gadolinium nitride (GdN), terbium nitride (TbN), dysprosium nitride (DyN), holmium nitride (HoN), erbium nitride (ErN), thulium nitride (TmN), ytterbium nitride (YbN), and lutetium nitride (LuN), and alloys of any two or more thereof, and wherein the magnesium-doped rare earth nitride material is a thin film.

\* \* \* \* \*